US012191874B2

(12) United States Patent
Baumann et al.

(10) Patent No.: US 12,191,874 B2
(45) Date of Patent: Jan. 7, 2025

(54) METHOD FOR PRECISELY DETECTING A SIGNAL FOR EXAMPLE OF A SENSOR

(71) Applicant: Robert Bosch GmbH, Stuttgart (DE)

(72) Inventors: Fabian Baumann, Affalterbach (DE); Bernhard Ledermann, Weil der Stadt (DE); Claudius Bevot, Stuttgart (DE); Florian Mezger, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 557 days.

(21) Appl. No.: 17/601,978

(22) PCT Filed: Apr. 7, 2020

(86) PCT No.: PCT/EP2020/059884
§ 371 (c)(1),
(2) Date: Oct. 7, 2021

(87) PCT Pub. No.: WO2020/216611
PCT Pub. Date: Oct. 29, 2020

(65) Prior Publication Data
US 2022/0200614 A1 Jun. 23, 2022

(30) Foreign Application Priority Data
Apr. 26, 2019 (DE) .......................... 102019206023.4

(51) Int. Cl.
*H03M 1/06* (2006.01)
*G01N 27/12* (2006.01)

(52) U.S. Cl.
CPC ........ *H03M 1/0609* (2013.01); *G01N 27/122* (2013.01)

(58) Field of Classification Search
CPC .. H03M 1/0609; H03M 1/122; H03M 1/1028; G01N 27/122
See application file for complete search history.

(56) References Cited

U.S. PATENT DOCUMENTS

| 7,541,952 B1 * | 6/2009 | Sankaran ............ H03M 1/1028 341/120 |
| 7,710,303 B2 | 5/2010 | Wojewoda et al. |
| 10,330,767 B2 * | 6/2019 | Das ...................... G01R 35/005 |

FOREIGN PATENT DOCUMENTS

| DE | 102011007068 A1 | 10/2012 |
| EP | 2277035 A1 | 1/2011 |

(Continued)

OTHER PUBLICATIONS

International Search Report for PCT/EP2020/059884, Issued Aug. 11, 2020.

(Continued)

*Primary Examiner* — David Z Huang
(74) *Attorney, Agent, or Firm* — NORTON ROSE FULBRIGHT US LLP; Gerard A. Messina

(57) ABSTRACT

A method for precise acquisition of a signal of a sensor, by an evaluation and control unit which has a multiplexer at whose inputs there is at least one reference voltage whose voltage value is known, a ground potential of the reference voltage, a measurement signal of the exhaust gas sensor, and a ground potential of the measurement signal. A computer is connected downstream from the multiplexer via a transmission path and via an ADC that converts a voltage between its two inputs into a digital value. The method provides that a plurality of individual measurements are carried out in which switching states of the multiplexer are modified, and digital values are subsequently acquired at the output of the ADC. The computer calculates a measurement value, corrected with regard to offset and gain, from these digital values.

7 Claims, 2 Drawing Sheets

(56) References Cited

FOREIGN PATENT DOCUMENTS

| | | | |
|---|---|---|---|
| JP | H08330962 | A | 12/1996 |
| JP | 2003060505 | A | 2/2003 |
| JP | 2012195773 | A | 10/2012 |
| WO | 2009135862 | A1 | 11/2009 |

OTHER PUBLICATIONS

"16-Bit, Data-Acquisition System With ADC, DACS, UPIOS, RTC, Voltage Monitors, and Temp Sensor," Maxim, Datasheet MAX1358B, 2010, pp. 1-71. <http://datasheets.maximintegrated.com/en/ds/MAX1358B.pdf> Oct. 4, 2021.

Ji et al. "A 220PJ/Pixel/Frame CMOS Image Sensor with Partial Settling Readout Architecture," 2016 IEEE Symposium on VLSI Circuits Digest of Technical Papers, 2016, pp. 1-2.

* cited by examiner

METHOD FOR PRECISELY DETECTING A SIGNAL FOR EXAMPLE OF A SENSOR

BACKGROUND INFORMATION

From the related art, methods are available with which an analog signal is transmitted along a transmission path and subsequently digitized, occurrent offset and gain errors being corrected. In these methods, it is always presupposed that the transmitted signals that are to be digitized are temporally constant, i.e., are in a settled state, so that a measurement value free of offset and gain errors can easily be obtained from the analog signal; see for example U.S. Pat. No. 7,710,303 B2. These methods are correspondingly slow.

SUMMARY

The present invention is based on the surprising finding by the inventors that, in a method in accordance with the present invention, measurement values that are corrected with regard to offset and gain can also be determined without the two levels at the inputs of the ADC (analog-digital converter) having settled for each individual measurement.

It is true that, in particular, each of the digital values obtained through the individual measurements is modified in comparison with the values that would be obtained after waiting for the settling of the levels at the inputs of the ADC; however, this modification takes place in a fundamentally similar manner for all digital values, so that the modifications at least partly mutually compensate one another in the calculation of the measurement value corrected with regard to offset and gain.

The present invention thus enables a precise and at the same time particularly fast acquisition of a signal, for example a signal of a sensor. However, it can also be applied to any other signal.

In the context of the present application, a system, after a change of its input variables, is in particular not regarded as settled until its output variables have already achieved at least 86% of the change resulting for them according to the stationary solution with the modified input variables.

In a development for this purpose, a system, after a change of its input variables, is in particular already regarded as settled when its output variables have already achieved at least 63% of the change resulting for them according to the stationary solution with the changed input variables.

In accordance with an example embodiment of the present invention, the method can provide that the following individual measurements are carried out:
a) Reference voltage measurement: the multiplexer connects the reference voltage to the first input of the ADC and connects a ground potential of the reference voltage to the second input of the ADC; a reference voltage value is ascertained at the output of the ADC; and/or
b) reference offset voltage measurement: the multiplexer connects the ground potential of the reference voltage to both inputs of the ADC; a reference offset voltage value is ascertained at the output of the ADC; and/or
c) measurement voltage measurement: the multiplexer connects the measurement voltage to the first input of the ADC and connects a ground potential of the measurement voltage to the second input of the ADC; a measurement voltage value is ascertained at the output of the ADC; and/or
d) measurement offset voltage measurement: the multiplexer connects the ground potential of the measurement voltage to both inputs of the ADC; a measurement offset voltage value is ascertained at the output of the ADC.

If the ground potential of the reference is physically identical to the ground potential of the measurement voltage, the individual measurements a) and d) can be simultaneously realized by a single individual measurement, whose result simultaneously provides the reference offset voltage value and the measurement offset voltage value.

Following this, it is in particular possible for the measurement value corrected with regard to offset and gain to be calculated according to the equation:

$$U\_MuC = U_{Ref} * (Z\_UM - Z\_UMoffset)/(Z\_UR - Z\_URoffset),$$

where
U_MuC is the measurement value corrected with regard to offset and gain;
$U_{Ref}$ is the known voltage value of the reference voltage;
Z_UM is the measurement voltage value;
Z_UMoffset is the measurement offset voltage value;
Z_UR is the reference voltage value;
Z_URoffset is the reference offset voltage value.

The effect on which the present invention is based, i.e. that the modifications explained above at least partly mutually compensate one another in the calculation of the measurement value corrected with regard to offset and gain from the digital values, is present to a particularly high degree when the evaluation and control unit is brought into the same initial state before each individual measurement. For this purpose, it can be provided that individual, or all, energy storage devices, functional values, digital memories, and/or functional blocks of the evaluation and control unit are reset before each individual measurement, to an identical, defined, but not necessarily stationary initial state.

The effect on which the present invention is based, i.e., that the modifications explained above at least partly mutually compensate one another in the calculation of the measurement value corrected with regard to offset and gain from the digital values, is also present to a particularly high degree when individual measurements have an identical timing relative to one another; i.e., in particular that immediately preceding these measurements, identical measurements, or other measurements of the same type, with the evaluation and control unit take place with the same temporal spacing; and/or when the switches of the multiplexer have a precise matching to one another; i.e. in particular that in the closed state these switches have identical resistance values, and that in the open state these switches have identical resistance values and/or that the switching times of these switches are identical. The concept of identity here includes only a fairly narrow range of fluctuation, for example plus/minus 2%.

Advantageously, for the operation of the sensor, it can be provided that the individual measurements and the calculation of the measurement value corrected with regard to offset and gain are cyclically repeated.

The sensor can be a lambda sensor, for example a broadband lambda sensor. The signals of the lambda sensor can be for example voltages that can be picked off between its supply lines. The evaluation and control unit can be realized by an ASIC.

DETAILED DESCRIPTION OF EXAMPLE EMBODIMENTS

Figure 1:
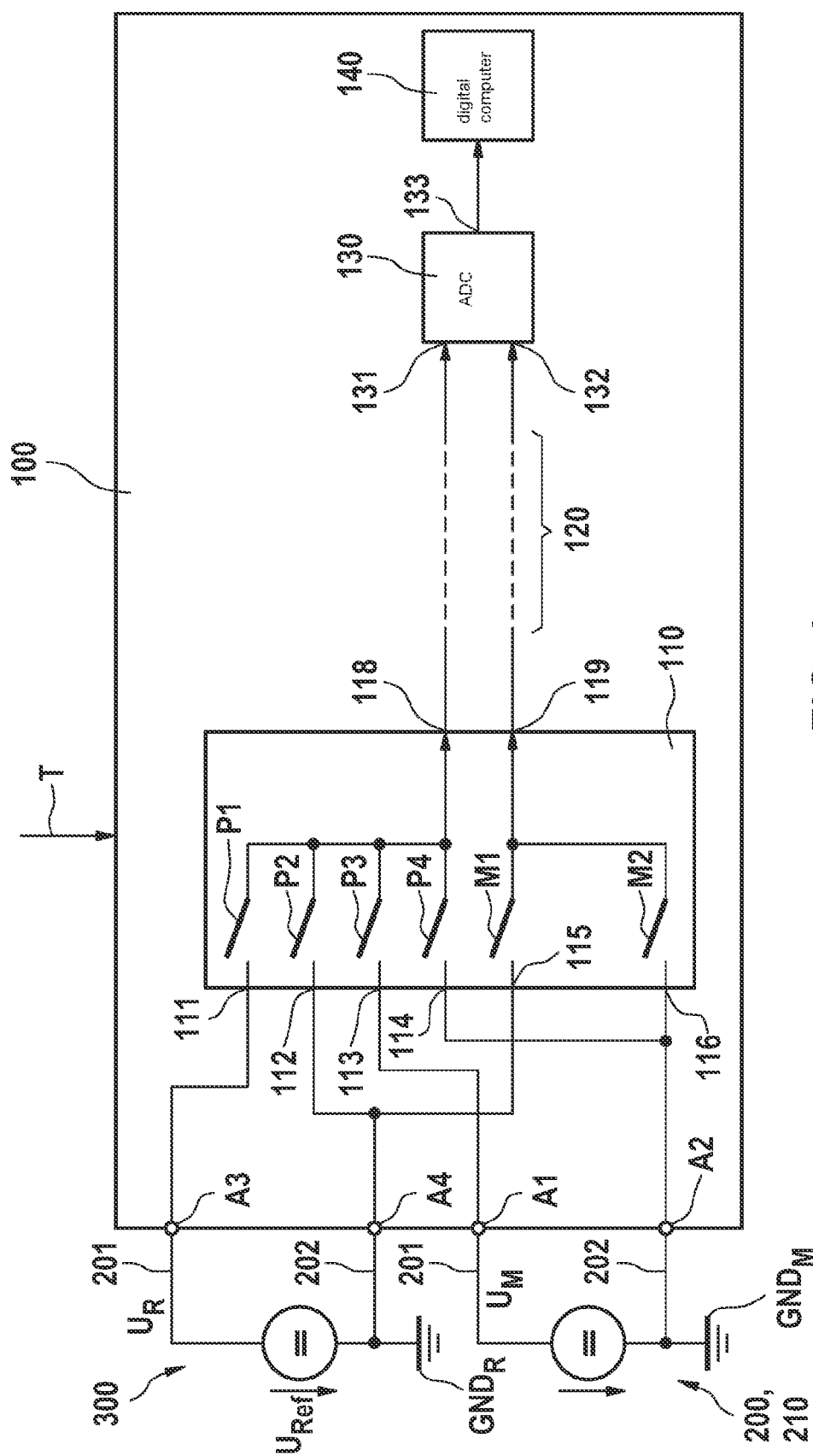
FIG. 1 shows an example of an electrical circuit with which the method according to the present invention can be carried out.

FIG. 1 shows an evaluation and control unit 100 for operating a broadband lambda sensor 200. Evaluation and control unit 100 is connected to electrical lines 201, 202 of a broadband lambda sensor 200 via terminals, of which only two terminals A1, A2 are shown in FIG. 1. These lines 201, 202 lead for example to an electrochemical cell 210 of broadband lambda sensor 200, so that at the sensor there are a measurement value UM of broadband lambda sensor 200, and its ground potential GND_M. Evaluation and control unit 100 is connected to a reference voltage source 300 and its ground potential GND_R via two further terminals A3, A4. Alternatively, reference voltage source 300 and its ground potential GND_R could also be part of evaluation and control unit 100. The actual value $U_{Ref}$ of the voltage provided by reference voltage source 300 is known very accurately and in addition is temporally constant.

Possible details of broadband lambda sensor 200 are presented for example in German Patent Application No. DE 10 2011 007 068 A1.

Evaluation and control unit 100 is shown only to the extent required for the understanding of the present invention. Possible details of evaluation and control unit 100 are presented for example in European Patent No. EP 2 277 035 B1.

Multiplexer 110 shown in exemplary fashion in FIG. 1 has six inputs 111, 112, 113, 114, 115, 116, a first of these inputs 111 being connected to reference voltage U_R, a second and a fifth of these inputs 112, 115 being connected to the ground potential of the reference voltage GND_R, a third of these inputs 113 being connected to measurement voltage U_M, and a fourth and a sixth of these inputs 114, 116 being connected to the ground potential of the measurement voltage GND_M.

Via a first switch P1 of multiplexer 110, assigned to first input 111 of multiplexer 110, and via further switches P2, P3, P4, M1, M2 of multiplexer 110, assigned to the further inputs 112, 113, 114, 115, 116 of multiplexer 110, first, second, third, and fourth input 111, 112, 113, 114 of multiplexer 110 are connectable to first output 118 of multiplexer 110, and fifth and sixth input 115, 116 of multiplexer 110 are connectable to a second output 119 of multiplexer 110. Switches P1, P2, P3, P4, M1, M2 of multiplexer 110 have a precise matching to one another; i.e., their internal resistances in the open state, their internal resistances in the closed state, and/or their switching times differ only slightly, for example by not more than 2%.

Downstream from the two outputs 118, 119 of multiplexer 110, there are connected—via a transmission path 120 that has for example one or more filters and one or more amplifiers and, if appropriate, further functional blocks, and that for example has a low-pass characteristic overall—inputs 131, 132 of analog-digital converter 130, which converts voltages between its two inputs 131, 132 into digital values, and forwards these digital values to a digital computer 140.

Figure 2:
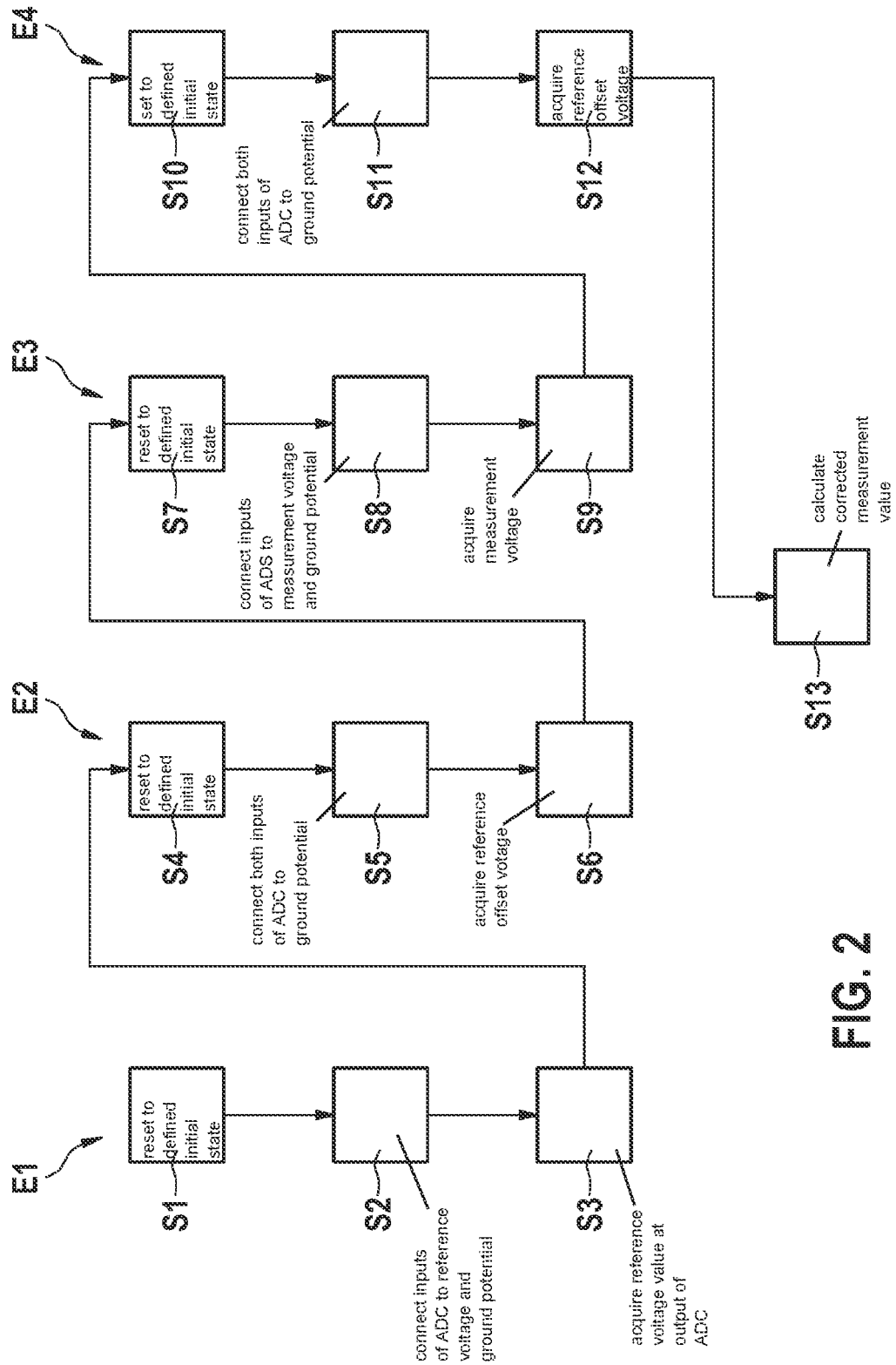
FIG. 2 shows the method according to the present invention in exemplary fashion in a flow diagram.

The method according to an example embodiment of the present invention runs for example in steps S1 through S13 (see FIG. 2), which are temporally defined for example by a clock pulse T that is applied externally to the evaluation and control unit or is generated by the evaluation and control unit itself:

Step S1: Resetting all functional blocks, energy storage devices, and digital memories to a defined initial state.

Step S2: Connecting inputs 131, 132 of ADC 130 to reference voltage U_R and its ground potential GND_R. For this purpose, first switch P1 and fifth switch M1 are closed.

Step S3: Acquiring reference voltage value Z_UR at output 133 of ADC 130, temporally before the two levels at inputs 130, 132 of ADC 130 have settled. Reference voltage value Z_UR is provided to digital computer 140.

Step S4: Resetting all functional blocks, energy storage devices, and digital memories to a defined initial state, as in step 1.

Step S5: Connecting both inputs 131, 132 of ADC 130 to the ground potential of reference voltage GND_R. For this purpose, second switch P2 and fifth switch M1 are closed.

Step S6: Acquiring reference offset voltage value Z_URoffset at output 133 of ADC 130, temporally before the two levels at inputs 131, 132 of ADC 130 have settled. Reference offset voltage value Z_URoffset is provided to digital computer 140.

Step S7: Resetting all functional blocks, energy storage devices, and digital memories to a defined initial state, as in step 4.

Step S8: Connecting inputs 131, 132 of ADC 130 to measurement voltage U_M and its ground potential GND_M. For this purpose, third switch P3 and sixth switch M2 are closed.

Step S9: Acquiring measurement voltage value Z_UM at output 133 of ADC 130, temporally before the two levels at inputs 131, 132 of ADC 130 have settled. Reference offset voltage value Z_UM is provided to digital computer 140.

Step S10: Resetting all functional blocks, energy storage devices, and digital memories to a defined initial state, as in steps 1, 4, and 7.

Step S11: Connecting both inputs 131, 132 of ADC 130 to the ground potential of the measurement voltage GND_M. For this purpose, fourth switch P4 and sixth switch M2 are closed.

Step S12: Acquiring reference offset voltage value Z_UMoffset at output 133 of ADC 130, temporally before the two levels at inputs 131, 132 of ADC 130 have settled. Reference offset voltage value Z_UMoffset is provided to digital computer 140.

Step S13: Calculating measurement value U_MuC, corrected with regard to offset and gain, from the previously obtained digital values Z_UM, Z_UMoffset, Z_UR, and Z_URoffset and the known value of reference voltage $U_{ref}$, according to the equation:

$$U\_MuC = U_{Ref} * (Z\_UM - Z\_UMoffset)/(Z\_UR - Z\_URoffset).$$

The thus obtained measurement value U_MuC, corrected with regard to offset and gain, can be technically reused. For example, it can be stored in nonvolatile fashion in evaluation and control unit 100, and/or can be provided as actual value of the voltage at electrochemical cell 210 to a controller of evaluation and control unit 100, which for its part physically controls broadband lambda sensor 200 through corresponding voltages and currents.

The measurement of the reference voltage value Z_UR (E1; method steps S1, S2, S3) takes place temporally close to the measurement of reference offset voltage value Z_URoffset (E2; method steps S4, S5, S6), so that essential physical changes, occurring in the meantime, of evaluation and control unit 100 due to temperature and/or aging are excluded.

The measurement of reference voltage value Z_UR (E1; method steps S1, S2, S3) takes place with the same timing as the measurement of reference offset voltage value Z_URoffset (E2; method steps S4, S5, S6), so that for both measurements, the same types of dynamic effects result from the fact that waiting does not take place for a settling of the levels at inputs 131, 132 of the ADC.

Both individual measurements E1, E2 take place, apart from their specific differences, in the same systemic state of evaluation and control unit 100; for example, between these individual measurements E1, E2 further currents and voltages are not connected if they could influence the measurements.

The measurement of measurement voltage value Z_UM (E3, method steps S7, S8, S9) takes place temporally close to the measurement of measurement offset voltage value Z_UMoffset (E4, method steps S4, S5, S6), so that substantial physical changes, taking place in the meantime, of evaluation and control unit 100 due to temperature and/or aging are excluded.

The measurement of reference voltage value Z_UM (E3; method steps S10, S11, S12) takes place with the same timing as the measurement of measurement offset voltage value Z_UMoffset (E4; method steps S4, S5, S6), so that for both measurements, the same types of dynamic effects result from the fact that waiting does not take place for a settling of the levels at inputs 131, 132 of the ADC.

Both individual measurements E3, E4 take place, apart from their specific differences, in the same systemic state of evaluation and control unit 100; for example, between these individual measurements E3, E4 further currents and voltages are not connected if they could influence the measurements.

In the present case, it is even the case that all individual measurements E1, E2, E3, and E4, apart from their specific differences, take place in the same systemic state of evaluation and control unit 100, with the same timing, and temporally close to one another.

The present invention also makes use in the example of the following technical advantage: the transmission function of the measurement path made up of multiplexer 110, transmission path 120, and ADC 130 is the same in all individual measurements E1, E2, E3, E4; therefore, the error in the measurement of the measurement voltage value is proportionally identical to the measurement error in the measurement of the reference voltage value. These errors therefore largely compensate one another in the calculation of measurement value U_MuC corrected with regard to offset and gain.

What is claimed is:

1. A method for the precise acquisition of a signal of a sensor by an evaluation and control unit electrically connected to the sensor, the evaluation and control unit having a multiplexer at whose inputs there is at least one reference voltage whose voltage value is known, a ground potential of the reference voltage, a measurement signal of an exhaust gas sensor, and a ground potential of the measurement signal, a computer being connected downstream from the multiplexer via a transmission path and via an analog to digital converter (ADC) that converts a voltage between two inputs of the ADC into a digital value, the method comprising the following steps:
   carrying out a plurality of individual measurements, wherein in each of the individual measurements, switching states of the multiplexer are modified, and in each of the individual measurements which digital values are subsequently acquired at an output of the ADC; and
   calculating, by the computer, a corrected measurement value, corrected with regard to offset and gain, from the digital values;
   wherein the digital values are each acquired before two levels at the inputs of the ADC have settled, or the analog to digital conversion by the ADC is begun before the two levels at the inputs of the ADC have settled,
   wherein the two levels at the inputs of the ADC are not considered settled until the output of the ADC achieves at least 86% of a change according to a stationary solution with the modified switching states of the multiplexer.

2. A method for the precise acquisition of a signal of a sensor by an evaluation and control unit electrically connected to the sensor, the evaluation and control unit having a multiplexer at whose inputs there is at least one reference voltage whose voltage value is known, a ground potential of the reference voltage, a measurement signal of an exhaust gas sensor, and a ground potential of the measurement signal, a computer being connected downstream from the multiplexer via a transmission path and via an analog to digital converter (ADC) that converts a voltage between two inputs of the ADC into a digital value, the method comprising the following steps:
   carrying out a plurality of individual measurements, wherein in each of the individual measurements, switching states of the multiplexer are modified, and in each of the individual measurements which digital values are subsequently acquired at an output of the ADC; and
   calculating, by the computer, a corrected measurement value, corrected with regard to offset and gain, from the digital values;
   wherein the digital values are each acquired before two levels at the inputs of the ADC have settled, or the analog to digital conversion by the ADC is begun before the two levels at the inputs of the ADC have settled,
   wherein the two levels at the inputs of the ADC are not considered settled until the output of the ADC achieves at least 86% of a change according to a stationary solution with the modified switching states of the multiplexer,
   wherein the carrying out step, the following individual measurements are carried out:
   a) a reference voltage measurement in which the multiplexer connects the reference voltage to a first input of the two inputs of the ADC and connects the ground potential of the reference voltage to a second input of the two inputs of the ADC, and a reference voltage value is ascertained at the output of the ADC,
   b) a reference offset voltage measurement in which the multiplexer connects the ground potential of the reference voltage both inputs of the two inputs of the ADC, and a reference offset voltage value is ascertained at the output of the ADC,
   c) a measurement voltage measurement in which the multiplexer connects a measurement voltage of the measurement signal to the first input of the ADC and connects the ground potential of the measurement signal to the second input of the ADC and a measurement voltage value is ascertained at the output of the ADC;

d) a measurement offset voltage measurement in which the multiplexer connects the ground potential of the measurement signal to both inputs of the two inputs of the ADC and a measurement offset voltage value is ascertained at the output of the ADC;

wherein the corrected measurement value U_MuC corrected with regard to offset and gain is calculated according to the following equation:

$$U\_MuC = U_{Ref} * (Z\_UM - Z\_UMoffset)/(Z\_UR - Z\_URoffset),$$

where

U_MuC is the corrected measurement value corrected with regard to offset and gain;

$U_{Ref}$ is the known voltage value of the reference voltage;

Z_UM is the measurement voltage value;

Z_UMoffset is the measurement offset voltage value;

Z_UR is the reference voltage value;

Z_URoffset is the reference offset voltage value.

3. The method as recited in claim 2, wherein the evaluation and control unit is brought into an identical initial state before each of the individual measurements.

4. The method as recited in claim 2, wherein the individual measurements have identical timing relative to one another.

5. The method as recited in claim 2, wherein switches of the multiplexer match one another.

6. The method as recited in claim 1, wherein the individual measurements and the calculation of the corrected measurement value corrected with regard to offset and gain are cyclically repeated.

7. The method as recited in claim 1, wherein the sensor is a broadband lambda sensor and the evaluation and control unit is an ASIC.

* * * * *